(12) United States Patent
Aimi et al.

(10) Patent No.: US 9,117,610 B2
(45) Date of Patent: Aug. 25, 2015

(54) INTEGRATED MICRO-ELECTROMECHANICAL SWITCHES AND A RELATED METHOD THEREOF

(71) Applicant: General Electric Company, Schenectady, NY (US)

(72) Inventors: Marco Francesco Aimi, Niskayuna, NY (US); Dan Kenrick Spence, Hartland, WI (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/314,344

(22) Filed: Jun. 25, 2014

(65) Prior Publication Data
US 2014/0305777 A1    Oct. 16, 2014

Related U.S. Application Data

(63) Continuation-in-part of application No. 13/307,262, filed on Nov. 30, 2011, now abandoned.

(51) Int. Cl.
| | |
|---|---|
| *H01H 51/22* | (2006.01) |
| *H01H 59/00* | (2006.01) |
| *B81B 7/00* | (2006.01) |

(52) U.S. Cl.
CPC ............ *H01H 59/0009* (2013.01); *B81B 7/008* (2013.01); *B81B 2201/00* (2013.01); *H01H 2059/0018* (2013.01)

(58) Field of Classification Search
CPC . H01H 59/0009; B81B 7/008; B81B 2201/00
USPC ............................................. 335/78; 200/181
See application file for complete search history.

(56) References Cited

U.S. PATENT DOCUMENTS

| | | |
|---|---|---|
| 6,373,007 B1 | 4/2002 | Calcatera et al. |
| 6,624,367 B1 * | 9/2003 | Chen ............................ 200/181 |

(Continued)

FOREIGN PATENT DOCUMENTS

| | | |
|---|---|---|
| EP | 2073237 A2 | 6/2009 |
| KR | 20020074331 A | 9/2002 |

(Continued)

OTHER PUBLICATIONS

Cho et al., "A Low-Voltage and Low-Power RF MEMS Series and Shunt Switches Actuated by Combination of Electromagnetic and Electrostatic Forces", IEEE Transactions On Microwave Theory And Techniques, vol. 53, Issue 7, Jul. 2005, pp. 2450-2457.

(Continued)

*Primary Examiner* — Bernard Rojas
(74) *Attorney, Agent, or Firm* — Melissa K. Dobson (57) ABSTRACT

A system includes a plurality of micro-electromechanical switches including a plurality of gates, coupled to each other. Each micro-electromechanical switch includes a beam electrode disposed on a substrate. A beam includes an anchor portion coupled to the beam electrode. The beam includes a first beam portion extending from the anchor portion along a first direction; and a second beam portion extending from the anchor portion along a second direction opposite to the first direction. A first control electrode and a first contact electrode are disposed on the substrate, facing the first beam portion. A second control electrode and a second contact electrode are disposed on the substrate, facing the second beam portion. The first control electrode and the second control electrode are coupled to form a gate among the plurality of gates. The plurality of micro-electromechanical switches is arranged in at least one of a series arrangement, parallel arrangement.

15 Claims, 6 Drawing Sheets

(56) References Cited

U.S. PATENT DOCUMENTS

| | | |
|---|---|---|
| 8,198,895 B2 | 6/2012 | Iannotti et al. |
| 8,610,519 B2 | 12/2013 | Keimel et al. |
| 8,638,093 B2 | 1/2014 | Aimi et al. |
| 2002/0123048 A1 | 9/2002 | Gau et al. |
| 2003/0015768 A1 | 1/2003 | Bosco et al. |
| 2004/0095205 A1* | 5/2004 | Schaffner et al. ............ 333/101 |
| 2004/0135649 A1 | 7/2004 | Sievenpiper |
| 2006/0126609 A1 | 6/2006 | Krockel |
| 2008/0211347 A1 | 9/2008 | Wright et al. |
| 2008/0254572 A1 | 10/2008 | Leedy |
| 2009/0159409 A1* | 6/2009 | Keimel et al. ................ 200/181 |
| 2010/0097776 A1 | 4/2010 | Gabara |
| 2011/0130721 A1 | 6/2011 | Foster et al. |
| 2012/0113550 A1 | 5/2012 | Anand et al. |
| 2012/0176135 A1* | 7/2012 | Iannotti et al. ............... 324/318 |
| 2013/0134018 A1 | 5/2013 | Aimi |
| 2014/0346622 A1* | 11/2014 | Stuber .......................... 257/416 |

FOREIGN PATENT DOCUMENTS

| | | |
|---|---|---|
| KR | 20020078703 A | 10/2002 |
| WO | 03010086 A2 | 2/2003 |

OTHER PUBLICATIONS

Ronald G. Polcawich, "Design, Fabrication, Test, And Evaluation Of Rf Mems Series Switches Using Lead Zirconate Titanate (Pzt) Thin Film Actuators", The Pennsylvania State University, A thesis in Materials Science and Engineering, Aug. 2007, 233 Pages.

S.-J. Park, I.Reines & G.Rebeiz ; "High-Q RF-MEMS Tunable Evanescent-Mode Cavity Filter"; Microwave Symposium Digest, 2009. MTT '09. IEEE MTT-S International; pp. 1145-1148.

Joanne Wellman et al., "High Power (>1W) Application RF MEMS Lifetime Performance Evaluation"; NEPP—RF MEMS Testing; Downloaded from Internet on Sep. 12, 2012:<http://nepp.nasa.gov/DocUploads/5FAB12BE-15FE-4A30-BA522BC13547FE60/RFMEMSX.pdf>; 30Pages.

* cited by examiner

INTEGRATED MICRO-ELECTROMECHANICAL SWITCHES AND A RELATED METHOD THEREOF

CROSS REFERENCE TO RELATED APPLICATIONS

This application is a continuation-in-part of the U.S. patent application Ser. No. 13/307,262, entitled "A MICRO-ELECTROMECHANICAL SWITCH AND A RELATED METHOD THEREOF", filed on Nov. 30, 2011.

BACKGROUND

The invention relates generally to micro-electromechanical devices, and more particularly, to integrated micro-electromechanical switches.

Micro-electromechanical system (MEMS) devices have a wide variety of applications and are prevalent in commercial products. One type of MEMS device is a MEMS switch. A typical MEMS switch includes one or more MEMS switches arranged in an array. MEMS switches are well suited for applications including cellular telephones, wireless networks, communication systems, and radar systems. In wireless devices, MEMS switches can be used as antenna switches, mode switches, transmit/receive switches, and the like.

Typical MEMS switches use an electroplated metal cantilever supported at one end and an electrical contact arranged at the other end of the metal cantilever. A control electrode is positioned below the metal cantilever. A direct current ("DC") actuation voltage is applied across the control electrode to the metal cantilever forcing the metal cantilever to bend downward and make electrical contact with a bottom signal trace. Once electrical contact is established, the circuit is closed and an electrical signal can pass through the metal cantilever to the bottom signal trace.

One type of MEMS device is a MEMS radio frequency (RF) switch. MEMS RF switches are used for wireless devices because of their low drive power characteristics and ability to operate in radio frequency ranges. However, a problem frequently occurs within MEMS RF switches when a significant RF voltage is applied between a beam electrode and a contact electrode. Such a voltage may couple on to the control electrode and self-actuate the switch. In other words, these MEMS switches typically suffer from a problem where the cantilever beam within the switch may actuate at the "OFF" state (self-actuation) due to the high voltage RF signal. Thus, the high voltage RF signal produces adequate electrostatic force to pull down the switch beam and cause failure.

Another drawback associated with the MEMS RF switches is the generation of a "hot switch" voltage based on a residual energy generated at the contact electrodes. Such a residual energy may be generated based on a residual voltage from the system and coupled energy from a gate line to the contact electrodes.

There is a need for an enhanced system that overcome drawbacks associated with a voltage standoff capability and generation of a hot switch voltage.

BRIEF DESCRIPTION

In accordance with one exemplary embodiment, a system having a plurality of micro-electromechanical switches including a plurality of gates, coupled to each other is disclosed. Each micro-electromechanical switch includes a beam electrode disposed on a substrate. A beam includes an anchor portion coupled to the beam electrode. The beam includes a first beam portion extending from the anchor portion along a first direction; and a second beam portion extending from the anchor portion along a second direction opposite to the first direction. A first control electrode and a first contact electrode are disposed on the substrate, facing the first beam portion. A second control electrode and a second contact electrode are disposed on the substrate, facing the second beam portion. The first control electrode and the second control electrode are coupled to form a gate among the plurality of gates. The plurality of micro-electromechanical switches is arranged in at least one of a series arrangement, parallel arrangement.

In accordance with another exemplary embodiment, an associated method is disclosed. The method involves applying an actuation voltage equally to a plurality of micro-electromechanical switches including a plurality of gates, coupled to each other. Each micro-electromechanical switch includes a beam electrode disposed on a substrate. A beam includes an anchor portion coupled to the beam electrode. The beam includes a first beam portion extending from the anchor portion along a first direction; and a second beam portion extending from the anchor portion along a second direction opposite to the first direction. A first control electrode and a first contact electrode are disposed on the substrate, facing the first beam portion. A second control electrode and a second contact electrode are disposed on the substrate, facing the second beam portion. The first control electrode and the second control electrode are coupled to form a gate among the plurality of gates. The plurality of micro-electromechanical switches is arranged in at least one of a series arrangement, parallel arrangement.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In accordance with certain embodiments of the present invention, a system includes a plurality of micro-electromechanical switches having a plurality of gates, coupled to each other. Each micro-electromechanical switch includes a beam electrode disposed on a substrate. The micro-electromechanical switch further includes a beam having an anchor portion coupled to the beam electrode, a first beam portion extending from the anchor portion along a first direction; and a second beam portion extending from the anchor portion along a second direction opposite to the first direction. The micro-electromechanical switch also includes a first control electrode and a first contact electrode disposed on the substrate, facing the first beam portion and a second control electrode and a second contact electrode disposed on the substrate, facing the second beam portion. The first control electrode and the second control electrode are coupled to form a gate among the plurality of gates. The plurality of micro-electromechanical switches is arranged in at least one of a series arrangement, parallel arrangement.

Figure 1:
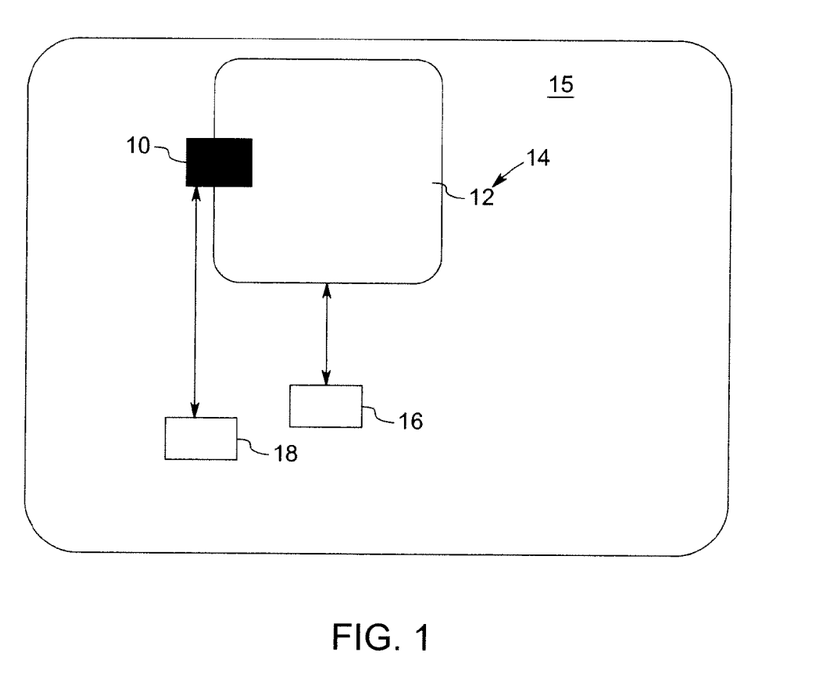
FIG. 1 is a diagrammatical representation of a micro-electromechanical system (MEMS) device for decoupling one or more surface coils of a coil system in accordance with an exemplary embodiment of the present invention.

Referring to FIG. 1, a micro-electromechanical system (MEMS) device 10 for decoupling one or more surface coils 12 of a coil system 14 in a radio frequency (RF) device 15, for example, a magnetic resonance imaging (MRI) system, is disclosed. It should be noted herein that although a MRI system is disclosed, in other embodiments, the MEMS device 10 may be used for other applications. For example, in another embodiment, the device 15 may be a radar system. In the illustrated embodiment, the MEMS device 10, allows switching to isolate one or more surface coils 12, particularly radio-frequency (RF) magnetic resonance coils. In one embodiment, during a MRI transmit operation, the MEMS device 10 is operable to decouple the surface coils 12 configured as receive surface coils. In one embodiment, the MEMS device 10 is in an open state during a transmit operation to decouple the surface coil 12 (a receive RF coil) from the coil system 14. The MEMS device 10 is in a closed state during a receive operation such that the surface coil 12 resonates and couples with the received MR signals such that the received MR signals are transmitted to an RF receiver 16. The MEMS device 10 is controlled by a switch controller 18 that switches the MEMS device 10 from the open state to the closed state, and vice versa. In some embodiments, the MEMS device 10 is in a normally open state (decoupled state) when the coil system 14 is not biased. However, in other embodiments, the MEMS device 10 is in a normally closed state when the coil system 14 is not biased.

It should be noted herein that in other embodiments, the MEMS device 10 may be used in connection with different types of magnetic resonance surface coils (also referred to herein as "surface coils") operating at different frequencies. The surface coils may be single frequency or dual-frequency (doubly-tuned) RF coils. The dual-frequency RF coils in some embodiments include concentric coil elements that are tuned to resonate at different frequencies, for example, one resonant for carbon and one resonant for proton, namely to resonate at the Larmor frequencies of carbon and proton to induce Larmor precession in the carbon atoms and protons. It should be noted that the MEMS device 10 is not limited to coupling only to receive surface coils. For example, the MEMS device 10 may be coupled to a transmit only coil or a combination of the transmit/receive coil.

Various embodiments of the MEMS device 10 may be provided as part of a single modality or multi-modality magnetic resonance imaging system. The MRI system may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, or the like.

The MEMS device 10 may be coupled to one or more surface coils 12, for example, one or more receive surface coils. In one embodiment, a single MEMS device 10 may be coupled to each surface coil 12. In another embodiment, a single MEMS device 10 may be coupled to a plurality of surface coils 12. In a specific embodiment, a separate MEMS device 10 may be coupled to each of the surface coils 12. Additionally, the MEMS device 10 may be configured to decouple all of the surface coils 12 or selected ones of the surface coils 12. Although the surface coils 12 may be illustrated in a particular arrangement, such as with an inner coil element and an outer element forming a pair of loop coils (dual-frequency or doubly-tuned RF coil element), the MEMS device 10 may be used to control decoupling of any type of MRI coil, particularly, any type of magnetic resonance receive surface coil or transmit surface coil. It should be noted that the MEMS device 10 is not limited to coupling only to receive surface coils. In one embodiment, the MEMS device 10 may be coupled to a transmit only coil or a combination transmit/receive coil.

Figure 2:
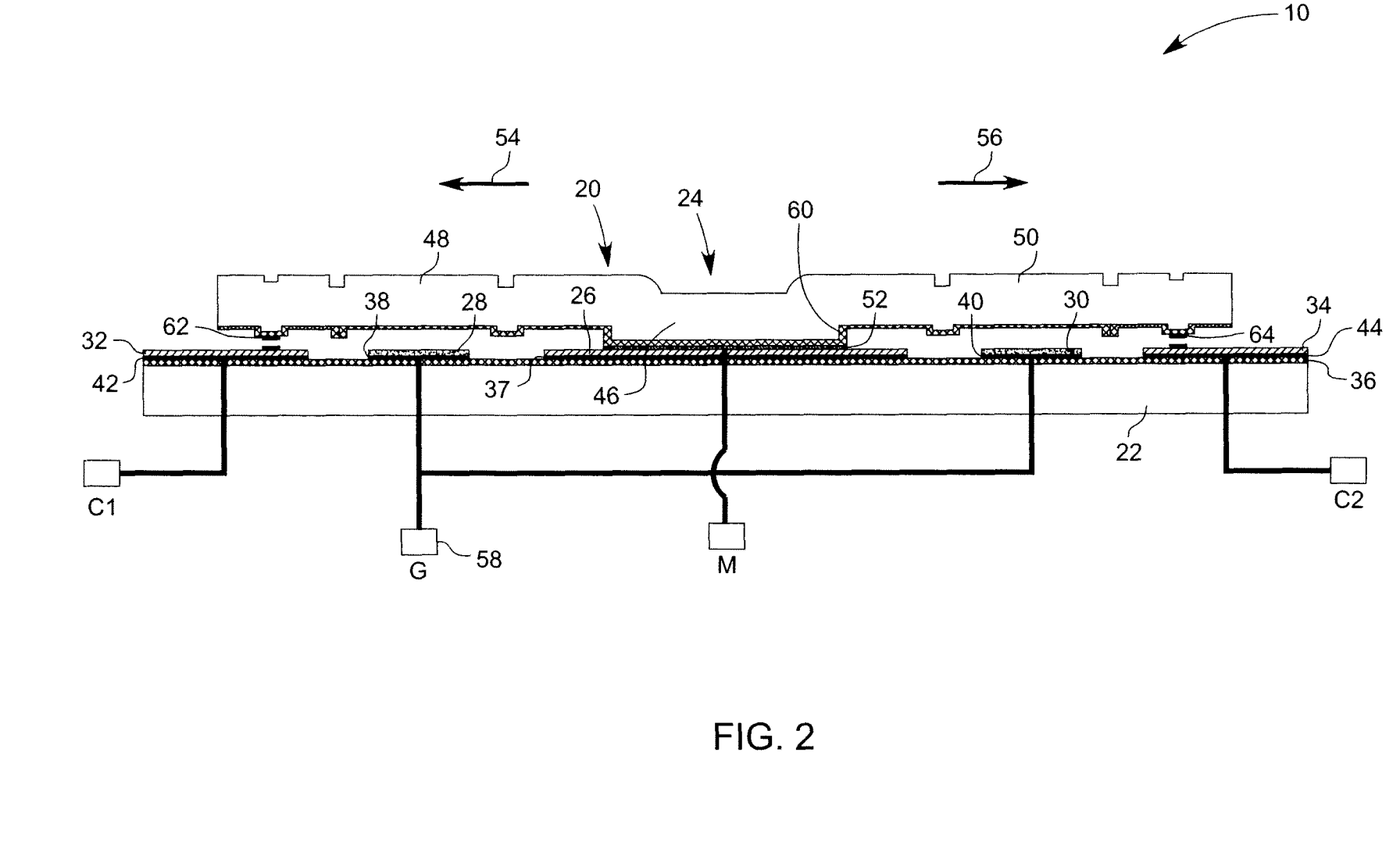
FIG. 2 is a sectional view of a MEMS device having a MEMS switch system in accordance with an exemplary embodiment of the present invention.

Referring to FIG. 2, the MEMS device 10 is shown. In the illustrated embodiment, the MEMS device 10 includes a MEMS switch 20. The MEMS device 10 includes a substrate 22, a beam 24, a beam electrode 26, first and second control electrodes 28, 30, and first and second contact electrodes 32, 34. In some embodiments, more than one substrate may be used. This back-to-back configuration can be instantiated by either one substrate or a plurality of substrates.

In the illustrated embodiment, a first intermediate layer 36 is disposed on the substrate 22. The first control electrode 28 is disposed on the first intermediate layer 36 via a second intermediate layer 38. The second control electrode 30 is disposed on the first intermediate layer 36 via a third intermediate layer 40. The first contact electrode 32 is disposed on the first intermediate layer 36 via a fourth intermediate layer 42. The second contact electrode 34 is disposed on the first intermediate layer 36 via a fifth intermediate layer 44. The beam electrode 26 is disposed on the on the first intermediate layer 36 via a sixth intermediate layer 37. It should be noted herein that number of intermediate layers may vary depending upon the application.

The beam 24 includes an anchor portion 46, a first beam portion 48, and a second beam portion 50. In some embodiments, the beam 24 may include more than one anchor portion, where the anchor portions are mutually coupled electrically. In the illustrated embodiment, the anchor portion 46 is coupled to the beam electrode 26 via a seventh intermediate layer 52. The first beam portion 48 extends from the anchor portion 46 along a first direction 54 and the second beam portion 50 extends from the anchor portion 46 along a second direction 56 opposite to the first direction 54. The first control electrode 28 and the first contact electrode 32 are disposed facing the first beam portion 48. The second control electrode 30 and the second contact electrode 34 are disposed facing the second beam portion 50. In the illustrated embodiment, the first control electrode 28 and the second control electrode 30 are coupled to form a gate 58. The gate 58 is any type of voltage source, for example, a square wave voltage source capable of driving or biasing the MEMS switches 20 to cause the beam 24 in the MEMS switch 20 to bend or deflect such that an electrical path is provided through the MEMS switch 20 (i.e., a closed state of the MEMS switch 20). A seed layer 60 is formed on the beam 24 facing the beam electrode 26, the first and second control electrodes 28, 30, the first and second contact electrodes 32, 34, and the first intermediate layer 36.

The beam 24 may be formed from different materials. For example, the beam 24 may be formed from one or more different metals, such as gold, gold alloy, nickel, nickel alloy, tungsten, or the like. The substrate 22 may include silicon, silica, quartz, or the like and the intermediate layers may include silicon nitride, silicon oxide, adhesion layers, or the like. The electrodes 26, 28, 30, 32, 34 may include metals such as gold, platinum, tantalum, or the like. In a specific embodiment, the electrodes 26, 28, 30, 32, 34 may include metal oxides. It should be noted herein that the composition of the beam 24, substrate 22, and electrodes 26, 28, 30, 32, 34 disclosed herein are not all inclusive and may vary depending upon the application. The MEMS switch 20 may be manufactured using technique involving deposition, anodization, patterning, etching, or the like.

The dimensions of the beam 24 may be varied, for example, based on particular bending or deflecting requirements, such as how much force is needed to bend or deflect the beam 24. The dimensions and configuration of the beam 24 also may be based on the voltage applied between the gate 58 and the beam electrode 26 used to deflect the beam 24. The dimensions and configuration of the beam 24 also may be based on the voltage of the gate 58 used to deflect the beam 24. It should be noted herein that the MEMS switch 20 may be formed from different materials and using different processes, for example, based on the particular application for the MEMS device 20 (e.g., MRI system application) to ensure that the device operates properly in a particular environment without affecting the environment.

In some embodiments, the MEMS device 10 may include a plurality of MEMS switches 20 that operate in either an open or closed state based on, for example, whether the imaging system (e.g., MRI system) is in a transmit or receive mode, respectively, when coupled to the surface coil. In some embodiments, the MEMS switches 20 may be coupled in series to form a group. In certain embodiments, a set or group of MEMS switches 20 may be coupled parallel to each other.

When no actuation voltage is applied between the gate 58 and the beam electrode 26, the first beam portion 48 and the second beam portion 50 are disposed at a first position in such a way that a first beam contact portion 62 of the first beam portion 48 and a second beam contact portion 64 of the second beam portion 50 are spaced apart from the first contact electrode 32 and the second contact electrode 34 respectively, referred to as an "open state". When an actuation voltage is applied between the gate 58 and the beam electrode 26, the first beam portion 48 and the second beam portion 50 are biased from the first position to a second position in such a way that the first beam contact portion 62 and the second beam contact portion 64 contacts the first contact electrode 32 and the second contact electrode 34 respectively allowing the current to flow from the first and second beam contact portions 62, 64 to the first and second contact electrodes 32, 34, referred to as a "closed state".

As discussed previously, MEMS RF switches are used for wireless devices because of their low power characteristics and ability to operate in radio frequency ranges. However, if a conventional three-terminal MEMS switch is provided into an RF blocking path, a voltage is generated between a contact electrode and a control electrode in the open state of the switch. This voltage is generated because the capacitance between the contact electrode and the beam electrode is of the same order as the capacitance between the contact electrode and the control electrode. This voltage may not be fine, if the switch is blocking a relatively low voltage compared to a gating voltage of the switch. However, when the RF voltage between the contact electrode and the beam electrode increases, more voltage will be generated across the control electrode that increases the risk of self-actuation of the switch that leads to damage of the MEMS switch.

In accordance with the embodiments of the present invention, two control electrodes, namely the first control electrode 28 and the second control electrode 30 are coupled to form a gate 58. The first control electrode 28 and the second control electrode 30 are configured in such a way that when an actuation voltage is applied between the gate 58 and the beam electrode 26, the actuation voltage is applied equally to the first control electrode 28 and the second control electrode 30. This allows actuation of the first beam portion 48 and the second beam portion 50 using the same gating signal.

Figure 3:
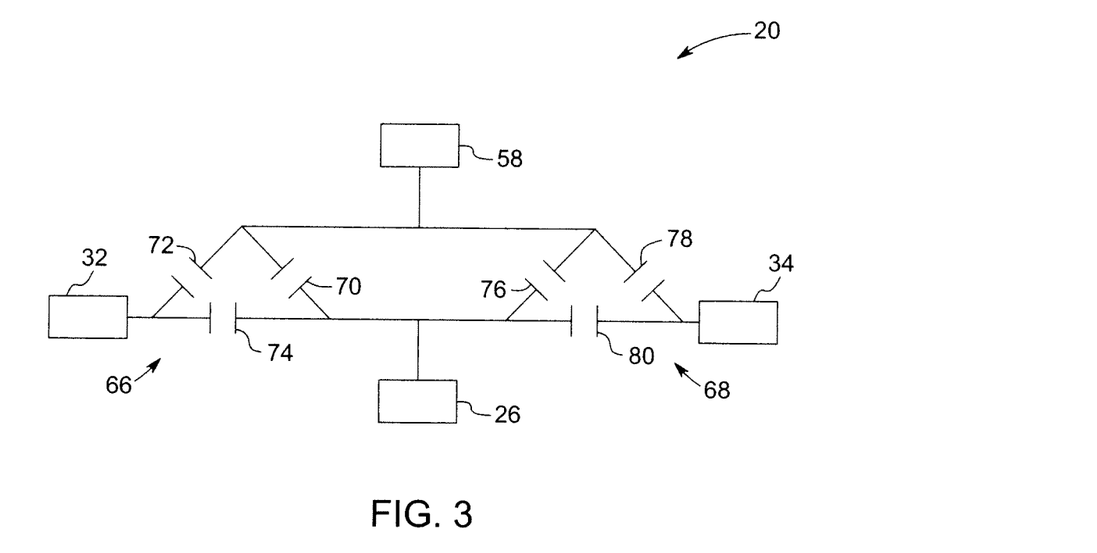
FIG. 3 is a diagrammatical representation of a MEMS switch in accordance with an embodiment of FIG. 2.

Referring to FIG. 3, the MEMS switch 20 including a back-to-back orientation in accordance with an embodiment of FIG. 2 is illustrated. In the illustrated embodiment, the MEMS switch 20 has a symmetrical arrangement modeled as two triangles 66, 68, each triangle having three capacitors, coupled to the contact electrodes 32, 34. The triangle 66 has a first capacitor 70 indicative of a capacitance between the gate 58 and the first beam portion 48, a second capacitor 72 indicative of capacitance between the gate 58 and the first contact electrode 32, and a third capacitor 74 indicative of capacitance between the first beam portion 48 and the first contact electrode 32. The triangle 68 has a fourth capacitor 76 indicative of a capacitance between the gate 58 and the second beam portion 50, a fifth capacitor 78 indicative of a capacitance between the gate 58 and the second contact electrode 34, and a sixth capacitor 80 indicative of a capacitance between the second beam portion 50 and the second contact electrode 34.

Figure 4:
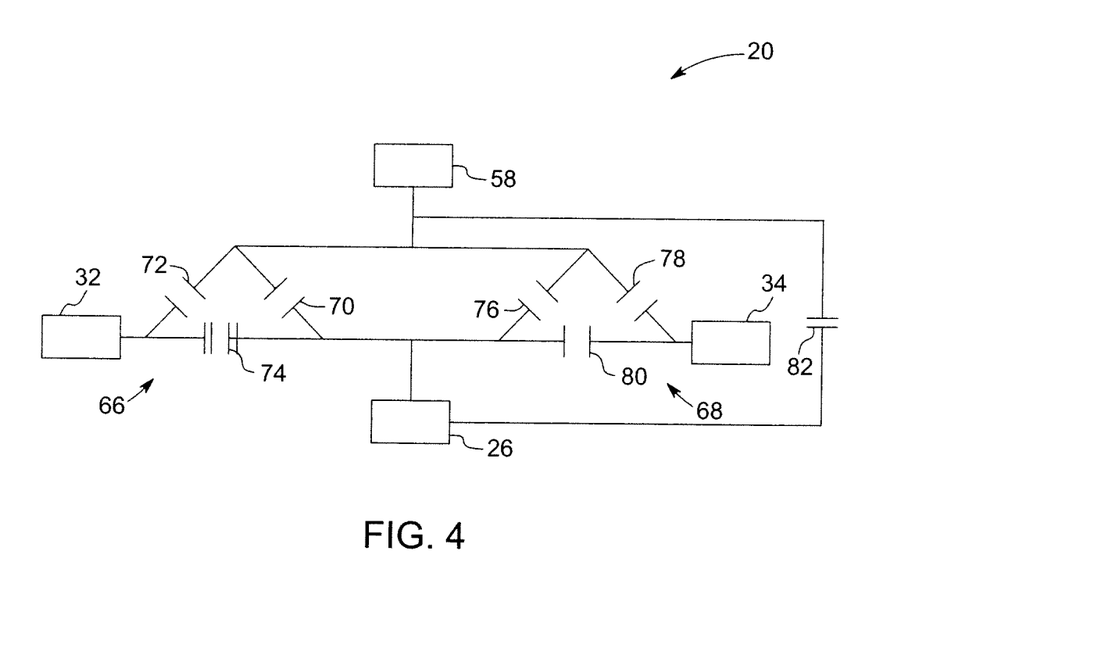
FIG. 4 is a diagrammatical representation of a MEMS switch in accordance with an embodiment of FIG. 2.

Referring to FIG. 4, the MEMS switch 20 includes a back-to-back orientation in accordance with an embodiment of FIG. 2. In the illustrated embodiment, the MEMS switch 20 has a similar arrangement as shown in FIG. 3. Additionally, the switch 20 is modeled as having a capacitor 82 indicative of a capacitance between the gate 58 and the beam electrode 26.

As discussed above, radio frequency signal blocking is performed when the MEMS switch 20 is in an open state with the first and second beam portions 48, 50 being separated from the first and second contact electrodes 32, 34 respectively. The voltage which is generated across the MEMS switch 20, includes high frequency signals, which causes capacitive coupling across each of the capacitances across the MEMS switch 20. As a result, in such a configuration, the voltage at the beam electrode 26 is equal to half the voltage across the first and second contact electrodes 32, 34. The voltage at the gate 58 is also equal to half the voltage across the first and second contact electrodes 32, 34 provided the capacitances are equal. As a result of such a configuration, self-actuation of the switch 20 is prevented.

The back-to-back configuration of the MEMS switch 20 allows for electrical communication between the two control electrodes 28, 30 (shown in FIG. 2). In one embodiment, this electrical communication is done via a resistor, and in other embodiments, this electrical communication is done passively via capacitors and/or inductors. In certain other embodiments, the electrical communication is done actively using a control logic. This electrical communication results in the same voltage at both the control electrodes, and the voltage at the gate is same as the voltage at the beam. Under conditions where the capacitances across the switch 20 are equal, a voltage generated between the beam electrode and gate is near zero even in presence of substantially higher radio frequency signals. The exemplary MEMS switch 20 has a stand-off voltage that is greater than 300 volts so as to prevent self-actuation of the switch 20 when the MEMS switch 20 is in an open state.

In accordance with certain embodiments of the present invention, a capacitance between the first beam portion and the first contact electrode, and between the second beam portion and the second contact electrode is the same. In some embodiments, a capacitance between the first contact electrode and first control electrode, and between the second contact electrode and the second control electrode is the same. In a specific embodiment, a capacitance between the beam and the gate is greater than at least twice a capacitance between the first control electrode and the first contact electrode.

The symmetry of the back-to-back configuration of the switch 20 is based on a layout, a process variability, and assembly configuration of the switch. One or more elements added to the switch may generate an asymmetrical configuration, causing residual voltage to be generated between the gate and the beam electrode of the switch. In one embodiment, this residual voltage can be mitigated passively using a capacitor between the gate and beam electrode. In another embodiment, the residual voltage can be mitigated actively using a control logic. As discussed previously, the exemplary switch may include one or more substrates.

In some embodiments, the life of the MEMS switch 20 may be enhanced by providing the plurality of capacitors in series with the first and second contact electrodes 32, 34 of the switch 20. These capacitors facilitate to minimize both the hot switch voltage and hot switch energy (i.e. total charge transferred upon closure of the switch). This implementation is particularly advantageous when the switch 20 is isolated from the influence of gate control logic.

Figure 5:
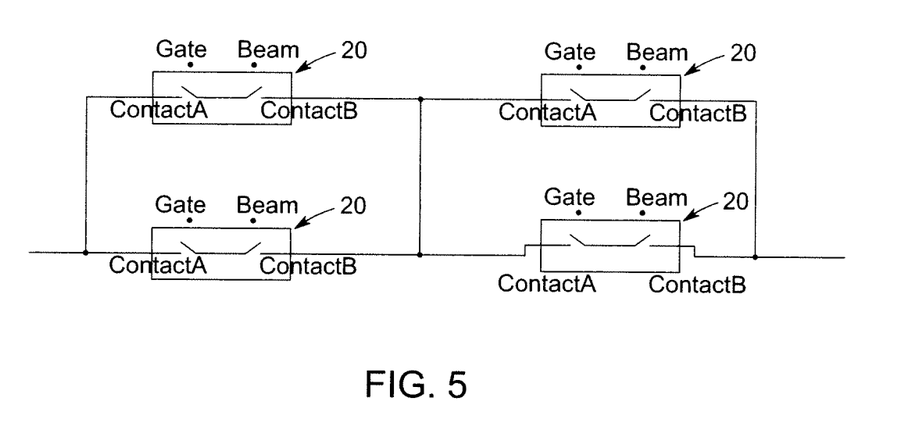
FIG. 5 is a schematic circuit diagram illustrating a plurality of MEMS switches coupled to each other in accordance with an exemplary embodiment.

FIG. 5 is a schematic circuit diagram illustrating a plurality of MEMS switches 20 coupled to each other in accordance with an exemplary embodiment. In the illustrated embodiment, four MEMS switches 20 are shown coupled to each other. Two MEMS switches 20 shown at the top are coupled to each other in series. Further, two MEMS switches 20 shown at the bottom are also coupled to each other in series. Two MEMS switches 20 shown at the top are coupled in parallel to the two MEMS switches 20 shown at the bottom.

In other embodiments, the number of MEMS switches 20 and series/parallel arrangement may vary. In one embodiment, a plurality of MEMS switches may be coupled only in series. In another embodiment, a plurality of MEMS switches may be coupled only in parallel. The number of MEMS switches 20 may vary depending on the particular application, for example, the environment in which the MEMS switch 20 is operating. For example, in a magnetic environment or an RF environment, the number of MEMS switch 20 may be determined based on the voltage pulse effect, such that a standoff voltage is overcome. In particular, based on an RF standoff voltage, a number and configuration of MEMS switches 20 may be varied such that self-actuation from the RF signals is prevented.

Figure 6:
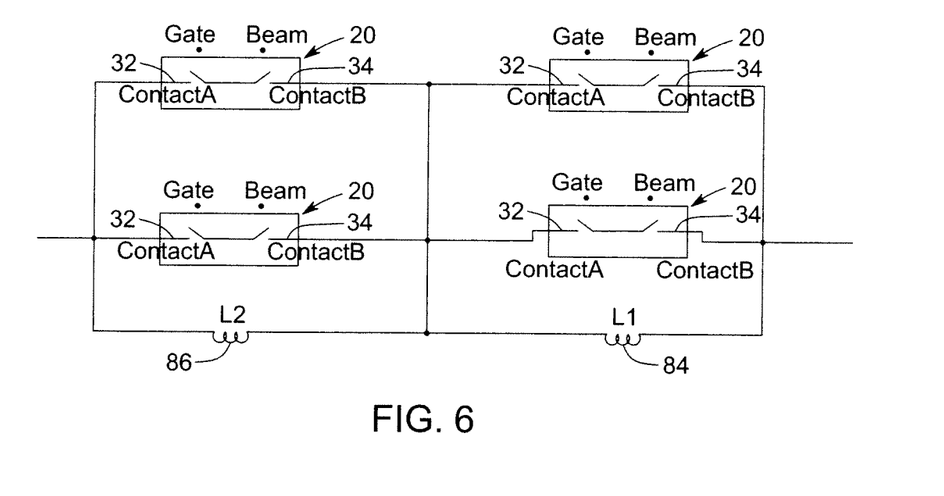
FIG. 6 is a schematic circuit diagram illustrating a plurality of MEMS switches coupled to each other and provided with a plurality of impedance devices in accordance with an exemplary embodiment.

FIG. 6 is a schematic circuit diagram illustrating a plurality of MEMS switches 20 coupled to each other in accordance with an exemplary embodiment of FIG. 5. In the illustrated embodiment, additionally, two impedance devices 84, 86 are coupled to the first and second contact electrodes 32, 34 of each MEMS switch 20. Specifically, the two impedance devices 84, 86 are inductors. In another embodiment, the two impedance devices may be resistors. In yet another embodiment, the two impedance devices may be capacitors. In other embodiments, the number of impedance devices may vary depending on the application. The impedance devices 84, 86 facilitates to minimize a voltage across the first and second contact electrodes 32, 34 during switching operation of the MEMS switch.

Figure 7:
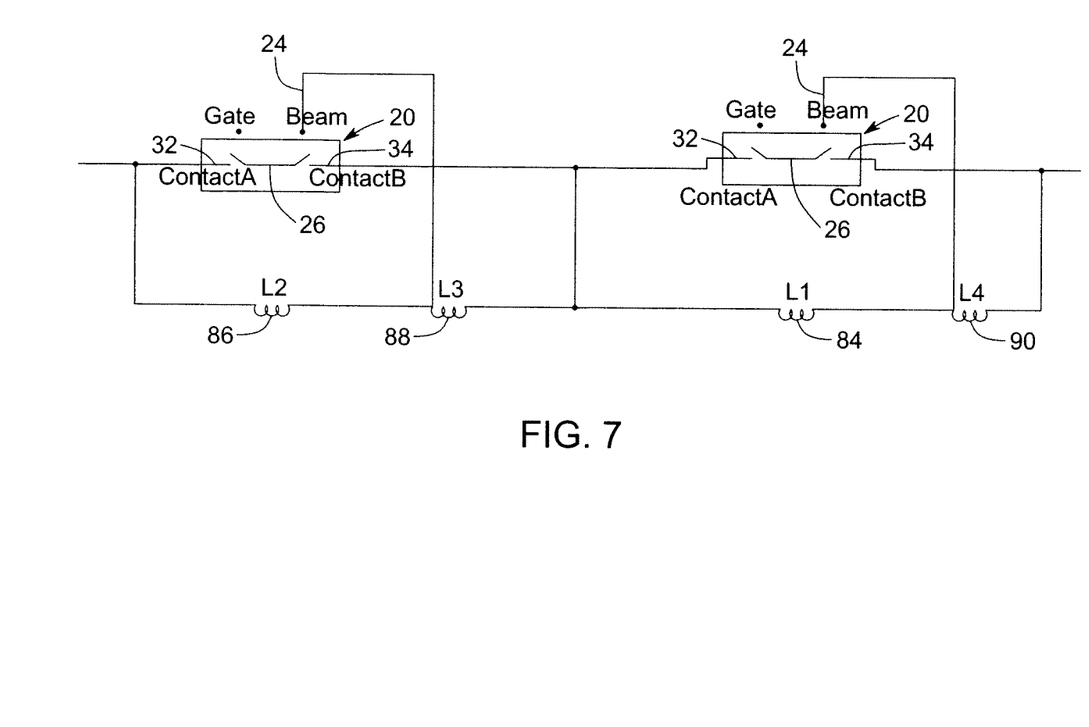
FIG. 7 is a schematic circuit diagram illustrating a plurality of MEMS switches coupled to each other and provided with a plurality of impedance devices in accordance with another exemplary embodiment.

FIG. 7 is a schematic circuit diagram illustrating two MEMS switches 20 coupled to each other in series in accordance with an exemplary embodiment. In the illustrated embodiment, four impedance devices 84, 86, 88, 90 are coupled to the first and second contact electrodes 32, 34 and the beam 24 of each MEMS switch 20. Specifically, the four impedance devices 84, 86, 88, 90 are inductors. In another embodiment, the four impedance devices may be resistors. In yet another embodiment, the four impedance devices may be capacitors. In other embodiments, the number of impedance devices may vary depending on the application.

In accordance with the illustrated embodiment, a voltage between the beam electrode 26 and the first contact electrode 32, the second contact electrode 34 is maintained at less than 0.5 volts via the impedance devices 84, 86, 88, 90 during closing of the plurality of micro-electromechanical switches 20.

Figure 8:
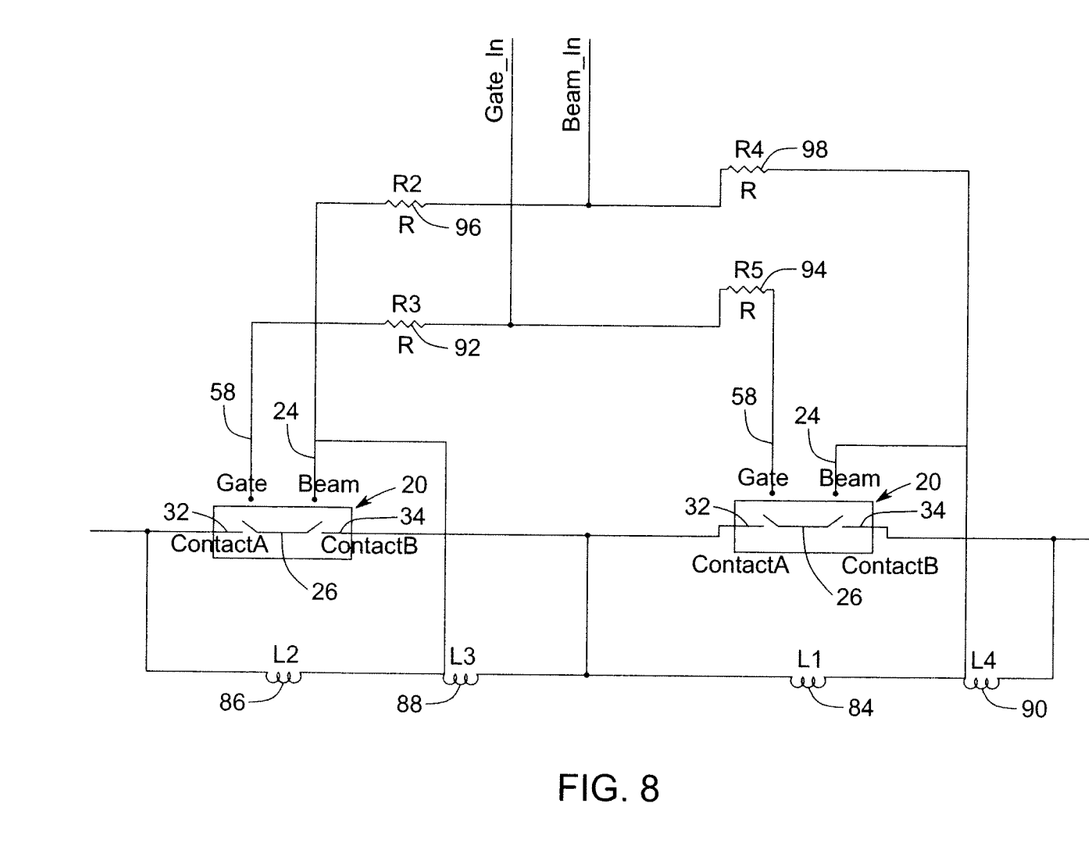
FIG. 8 is a schematic circuit diagram illustrating a plurality of MEMS switches coupled to each other and provided with a plurality of impedance devices in accordance with yet another exemplary embodiment.

FIG. 8 is a schematic circuit diagram illustrating two MEMS switches 20 coupled to each other in series in accordance with an exemplary embodiment. In the illustrated embodiment, four impedance devices 84, 86, 88, 90 are coupled to the first and second contact electrodes 32, 34 and the beam 24 of each MEMS switch 20. Additionally, two impedance devices 92, 94 are coupled to the gate 58 of each MEMS switch. Further, two more impedance devices 96, 98 are coupled to the beam 24 of each MEMS switch 20. Specifically, the impedance devices 92, 94, 96, 98 are resistors. In another embodiment, the additional impedance devices may be capacitors. In yet another embodiment, the additional impedance devices may be inductors. In other embodiments, the number of impedance devices may vary depending on the application. In accordance with the illustrated embodiment, the far left and far right wires (not shown) are coupled to a high voltage (for example, 1500 volts), a high frequency (for example, greater than 50 MHz) source, for example, the magnetic resonance coil element. When a high voltage is passed across the plurality of switches 20 in an open state, the applied voltage is shared by the switches 20 due to a parasitic impedance of the impedance devices of the plurality of MEMS switches 20 and more specifically the parasitic capacitance between the beam 24 and the gate 58 of each switch 20.

In accordance with the embodiments of the present invention, a voltage between the beam electrode 26 and the gate 58 is maintained less than 10 volts via the impedance devices 92, 94, 96, 98 during sharing of the actuation voltage between the plurality of micro-electromechanical switches. When a voltage is established between the beam electrode and the gate, the standoff capability of the switch is reduced. Such a voltage is established due to a parasitic capacitance of the switch from the beam electrode to the gate. The established voltage starts to break down when an array of MEMS switches are coupled to each other because the impedance between the plurality of gates of the switches starts to affect the performance of the switches. For example, for a plurality of switches coupled to each other, if an impedance between a left most MEMS switch and a gate line of a center MEMS switch is less, then a gate voltage of the left most switch is shifted towards a beam voltage of the center MEMS switch, causing a reduction in the standoff voltage. In accordance with the embodiments of the present invention, when impedance is added between the gates, such a voltage shift reduced. The magnitude of the impedances between the gates are decided based on a capacitance between the beam electrode and gate of each MEMS switch.

As discussed previously, a voltage generated within a magnetic resonance coil maybe several times a voltage capability of a back-to-back MEMS switch. In accordance with the embodiments of FIGS. 5-8, the plurality of MEMS switches 20 is configured to share an applied voltage across the plurality of MEMS switches 20, prevent excessive voltage coupling from the first and second contact electrodes 32, 34 to the gate 58, and maintain low voltage across the contact electrodes 32, 34 during switching operation. In one embodiment, the plurality of MEMS switches 20 is configured to share an applied voltage equally across the plurality of MEMS switches 20. In one specific embodiment, the plurality of MEMS switches 20 is configured to control voltage coupling between the plurality of MEMS switches via the plurality of gates 58. The plurality of impedance device facilitates to modify influence of an external stimulus around the plurality of micro-electromechanical switches 20.

It should be noted herein that life of the MEMS switch may be based on an amount of residual voltage generated across the contact electrodes, when the MEMS switch is in a close state. Such a voltage may be typically referred to as a "hot switch voltage". The hot switch voltage may be generated based on a residual voltage from the system, and also based on the coupled energy from the gate line to the contact electrodes. This residual voltage on the contact electrodes is a consequence of the parasitic capacitance between the gate and the contact electrodes. In applications, where the RF voltage is removed before actuating the switch, there is potential for residual low frequency or DC voltage to still remain across the switch due to the low open state capacitance and low leakage current. In accordance with the embodiments of the present invention, such an effect is mitigated by allowing electrical communication between the contact electrodes and the beam electrode in each switch. This electrical communication can be done via impedance devices such as resistors, inductors, capacitors, or the like. Such electrical communication allows for low frequency components of signal to pass through the open switch while maintaining the required high frequency blocking. In some embodiments, a single gate is used to actuate array of switches 20 in series allowing for a doubling of the gate voltage without increasing the need for extra gates.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
a plurality of micro-electromechanical switches comprising a plurality of gates, coupled to each other, wherein each micro-electromechanical switch further comprises:
a substrate;
a beam electrode disposed on the substrate;
a beam comprising an anchor portion coupled to the beam electrode, a first beam portion extending from the anchor portion along a first direction; and a second beam portion extending from the anchor portion along a second direction opposite to the first direction;
a first control electrode and a first contact electrode disposed on the substrate, facing the first beam portion; and
a second control electrode and a second contact electrode disposed on the substrate, facing the second beam portion; wherein the first control electrode and the second control electrode are coupled to form a gate among the plurality of gates; and
at least one impedance device comprising a parasitic impedance of the plurality of micro-electromechanical switches, coupled to at least one of (i) the plurality of gates (ii) the first contact electrode and the first beam portion (iii) the second contact electrode and the second beam portion (iv) the beam of each micro-electromechanical switch;
wherein the plurality of micro-electromechanical switches is arranged in at least one of a series arrangement, parallel arrangement.

2. The system of claim 1, wherein each micro-electromechanical switch comprises a micro-electromechanical radio frequency switch.

3. The system of claim 1, wherein each micro-electromechanical switch is disposed in a device configured to operate in a radio frequency range.

4. The system of claim 3, wherein the device comprises a magnetic resonance imaging system comprising a single modality imaging system or a multi-modality imaging system.

5. The system of claim 4, wherein the each micro-electromechanical switch is configured to couple and decouple one or more radio frequency receive surface coils, radio frequency transmit surface coils of the magnetic resonance imaging system.

6. A method comprising
applying an actuation voltage equally to a plurality of micro-electromechanical switches comprising a plurality of gates, coupled to each other, wherein each micro-electromechanical switch further comprises:
a substrate;
a beam electrode disposed on the substrate;
a beam comprising an anchor portion coupled to the beam electrode, a first beam portion extending from the anchor portion along a first direction; and a second beam portion extending from the anchor portion along a second direction opposite to the first direction;
a first control electrode and a first contact electrode disposed on the substrate, facing the first beam portion; and
a second control electrode and a second contact electrode disposed on the substrate, facing the second beam portion; wherein the first control electrode and the second control electrode are coupled to form a gate among the plurality of gates; and
generating a parasitic impedance for the plurality of micro-electromechanical switches via at least one impedance device;
wherein the at least one impedance device is coupled to at least one of (i) the plurality of gates (ii) the first contact electrode and the first beam portion (iii) the second contact electrode and the second beam portion (iv) the beam of each micro-electromechanical switch; wherein the plurality of micro-electromechanical switches is arranged in at least one of a series arrangement, parallel arrangement.

7. The method of claim 6, further comprising maintaining a voltage between the beam electrode and the first contact electrode, the second contact electrode at less than 0.5 volts via the at least one impedance device during closing of the plurality of micro-electromechanical switches.

8. The method of claim 6, further comprising modifying influence of an external stimulus around the plurality of micro-electromechanical switches via the at least one impedance device.

9. The method of claim 6, further comprising sharing an actuation voltage across the plurality of micro-electromechanical switches.

10. The method of claim 9, further comprising maintaining a voltage between the beam electrode and the gate at less than 10 volts via the at least one impedance device during sharing of the actuation voltage between the plurality of micro-electromechanical switches.

11. The method of claim 6, further comprising generating a parasitic capacitance between the beam and the gate.

12. The method of claim 6, further comprising applying an actuation voltage equally to the plurality of micro-electromechanical switches.

13. The method of claim 6, further comprising controlling voltage coupling from at least one of the first and second contact electrodes to the gate.

14. The method of claim 6, further comprising controlling voltage coupling between the plurality of electro-mechanical switches via the plurality of gates.

15. The method of claim 6, further comprising minimizing a voltage across the first and second contact electrodes during switching operation.

* * * * *

UNITED STATES PATENT AND TRADEMARK OFFICE
CERTIFICATE OF CORRECTION

PATENT NO.        : 9,117,610 B2                                        Page 1 of 1
APPLICATION NO.   : 14/314344
DATED             : August 25, 2015
INVENTOR(S)       : Aimi et al.

It is certified that error appears in the above-identified patent and that said Letters Patent is hereby corrected as shown below:

In the Specification

In Column 2, Line 52, delete "FIG. 2; and" and insert -- FIG. 2; --, therefor.

In Column 5, Line 37, delete "MEMS device 20" and insert -- MEMS device 10 --, therefor.

Signed and Sealed this
Fifth Day of January, 2016

Michelle K. Lee
*Director of the United States Patent and Trademark Office*